(12) United States Patent
Kim

(10) Patent No.: US 7,505,270 B2
(45) Date of Patent: Mar. 17, 2009

(54) DISPLAY MODULE

(75) Inventor: Myoung-Kon Kim, Suwon-si (KR)

(73) Assignee: Samsung SDI Co., Ltd., Suwon (KR)

(*) Notice: Subject to any disclaimer, the term of this patent is extended or adjusted under 35 U.S.C. 154(b) by 404 days.

(21) Appl. No.: 11/334,305

(22) Filed: Jan. 17, 2006

(65) Prior Publication Data

US 2006/0158845 A1 Jul. 20, 2006

(30) Foreign Application Priority Data

Jan. 20, 2005 (KR) .............. 10-2005-0005382

(51) Int. Cl.
- H05K 7/20 (2006.01)
- H01J 17/49 (2006.01)
- H01R 4/66 (2006.01)

(52) U.S. Cl. .............. 361/704; 313/46; 313/582; 361/707; 361/708; 361/715

(58) Field of Classification Search .............. None
See application file for complete search history.

(56) References Cited

U.S. PATENT DOCUMENTS

| | | | |
|---|---|---|---|
| 5,719,752 A * | 2/1998 | Mori et al. | 361/807 |
| 7,084,568 B2 * | 8/2006 | Kim | 313/582 |
| 2003/0025428 A1 | 2/2003 | Kim et al. | |
| 2005/0079748 A1 * | 4/2005 | Kim | 439/92 |
| 2005/0088092 A1 * | 4/2005 | Kim et al. | 313/582 |
| 2005/0099106 A1 * | 5/2005 | Kim et al. | 313/46 |

FOREIGN PATENT DOCUMENTS

| | | |
|---|---|---|
| CN | 1477671 A | 2/2004 |
| JP | 10-040823 | 2/1998 |
| JP | 10-116036 | 5/1998 |
| JP | 10-214045 | 8/1998 |
| JP | 10-254366 | 9/1998 |
| JP | 10-319863 | 12/1998 |
| JP | 11-038893 | 2/1999 |
| JP | 11-284379 | 10/1999 |

(Continued)

OTHER PUBLICATIONS

Notice to Submit Response by Korean Intellectual Property Office on Sep. 11, 2006.

*Primary Examiner*—Gregory D Thompson
(74) *Attorney, Agent, or Firm*—Knobbe Martens Olson & Bear LLP

(57) ABSTRACT

A display module, used for, e.g., a plasma display panel, is disclosed. In one embodiment, the display module includes a display panel, a drive circuit board driving the display panel, and a chassis base supporting the display panel and the drive circuit board. A curved portion is formed on the chassis base with a predetermined width, a boss is installed on an upper surface of the curved portion, and the drive circuit board is installed on the top of the boss. According to embodiments of the present invention, the strength of the chassis base constituting the display module is reinforced, without requiring a separate reinforcement member, and simultaneously the heat and noise generated by the display panel and the drive circuit board during operation can be appropriately dissipated and prevented.

11 Claims, 4 Drawing Sheets

FOREIGN PATENT DOCUMENTS

| | | |
|---|---|---|
| JP | 2001-013883 | 1/2001 |
| JP | 2001-324942 | 11/2001 |
| JP | 2001-345586 | 12/2001 |
| JP | 2003-084678 | 3/2003 |
| JP | 2003-115568 | 4/2003 |
| JP | 2003-195773 | 7/2003 |
| JP | 2003-216056 | 7/2003 |
| JP | 2003-216057 | 7/2003 |
| JP | 2004-004705 | 1/2004 |
| JP | 2004-126151 | 4/2004 |

* cited by examiner

DISPLAY MODULE

CROSS-REFERENCE TO RELATED PATENT APPLICATION

This application claims the benefit of Korean Patent Application No. 10-2005-0005382, filed on Jan. 20, 2005, in the Korean Intellectual Property Office, the disclosure of which is incorporated herein in its entirety by reference.

BACKGROUND OF THE INVENTION

1. Field of the Invention

The present invention relates to a display module which can be used for a plasma display panel device or other flat panel display devices, and more particularly, to a display module having reinforced strength and improved heat dissipation performance and noise reduction performance.

2. Description of the Related Technology

FIG. 1 is a perspective view of a display module of a plasma display device as an example to explain the structure of a display module according to the prior art. FIG. 2 is a cross-sectional view taken along line II-II of FIG. 1. Referring to FIGS. 1 and 2, the display module includes a display panel 50 having a front panel 51 and a rear panel 52, a plurality of drive circuit boards 40 electrically connected to the display panel 50 via a plurality of connection cables 20, a chassis 10 including a chassis base 11 and a reinforcement member 12. The chassis base 11 supports the display panel 50 and the drive circuit boards 40. In FIG. 1, reference numeral 21 indicates an integrated circuit. In FIG. 2, reference numerals 53 and 54 represent a heat dissipation sheet and an adhesive tape, respectively. Furthermore, reference numerals 41 and 42 represent a boss and a screw, respectively.

Typically, the rear panel 52 is attached to a front surface of the chassis base 11. The drive circuit boards 40 are attached to a rear surface of the chassis base 11. The chassis base 11 protects the display panel 50 and the drive circuit boards 40 from being deformed by an external impact or self-weight. To reinforce the strength of the chassis base 11, the reinforcement member 12 is additionally installed on an upper surface of the chassis base 11 in an area where the drive circuit boards 40 are not arranged.

In general, the display panel 50 and the drive circuit boards 40 generate a large amount of heat, noise, and vibration during operation. Also, the heat, noise, and vibration vibrations are transferred to the chassis base 11 and the drive circuit boards 40. The heat, noise, and vibration generated by the display panel 50 may adversely affect the drive circuit board 40 and vice versa.

In particular, when the heat generated during operation is not appropriately dissipated, circuit devices of the drive circuit board 40 can be damaged. Furthermore, the noise and vibrations can give viewers an unpleasant experience or may weaken adhesiveness of a soldering portion. Thus, there is a need for the chassis base 11 to appropriately reduce the heat and noise.

SUMMARY OF CERTAIN INVENTIVE ASPECTS

One aspect of the present invention provides a display module having a chassis base that does not need a separate reinforcement member for the chassis base.

Another aspect of the present invention provides a display module producing superior heat dissipation performance and noise reduction performance.

Another aspect of the present invention provides a display module which includes a display panel, a drive circuit board driving the display panel, and a chassis base supporting the display panel and the drive circuit board, wherein a raised or curved portion is formed on the chassis base with a predetermined width, a boss is installed on an upper surface of the curved portion, and the drive circuit board is installed on the top of the boss.

In one embodiment, a heat dissipation sheet having a predetermined size smaller than the display panel and a double-sided adhesive tape are disposed between the display panel and the chassis base, and a sound absorption (or noise reduction) member is installed in a space formed between the curved portion and at least one of the heat dissipation sheet and the display panel.

In one embodiment, a heat dissipation sheet and a double-sided adhesive tape are disposed between the display panel and the chassis base, and a heat transfer medium is provided in a space formed between the curved portion and at least one of the heat dissipation sheet and the display panel.

In another embodiment, a heat dissipation sheet and a double-sided adhesive tape are disposed between the display panel and the chassis base, and a sound absorption (or noise reduction) member and a heat transfer medium are installed in a space formed between the curved portion and at least one of the heat dissipation sheet and the display panel.

In one embodiment, the heat transfer medium is formed of at least one of the following materials: graphite, silicon, acryl, and urethane which exhibit superior heat conductivity.

In one embodiment, the sound absorption material is formed of at least one of the following materials: expanded polystyrene, sponge, and asbestos which are porous materials.

In one embodiment, the display module is used for a plasma display panel.

BRIEF DESCRIPTION OF THE DRAWINGS

Embodiments of the present invention will be described with reference to the attached drawings.

DETAILED DESCRIPTION OF CERTAIN INVENTIVE EMBODIMENTS

Figure 3:
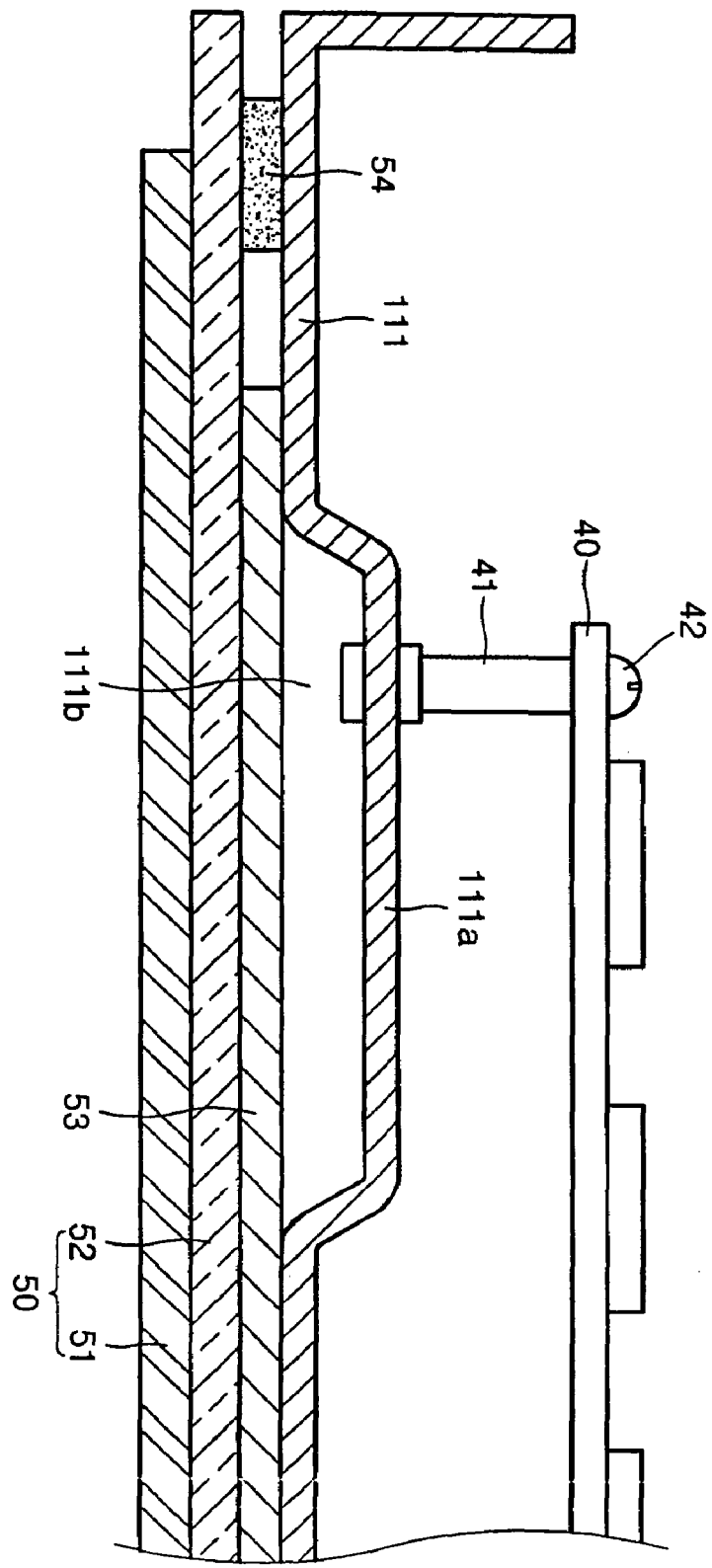
FIG. 3 is a cross-sectional view showing the structure of a display module according to an embodiment of the present invention.

FIG. 3 is a cross-sectional view showing the structure of a display module according to an embodiment of the present invention. Referring to FIG. 3, the display module includes the display panel 50, the drive circuit board 40, and a chassis base 111.

In one embodiment, the display panel 50 may be a plasma display panel including the front panel 51 and the rear panel 52 which are coupled to each other. In another embodiment, the display panel 50 may be another flat panel display which is supported by a panel supporting structure. In one embodiment, the rear panel 52 is fixed to the chassis base 111 using, for example, a double-sided adhesive tape 54 as shown in FIG. 3.

The drive circuit board 40, including a plurality of circuit devices for driving the display panel 50, may be a typical printed circuit board. In one embodiment, the drive circuit board 40 is fixed to a rear surface of the chassis base 111 by way of a boss 41 installed on the chassis base 111 using, for example, a screw 42 as shown in FIG. 3.

Figure 1:
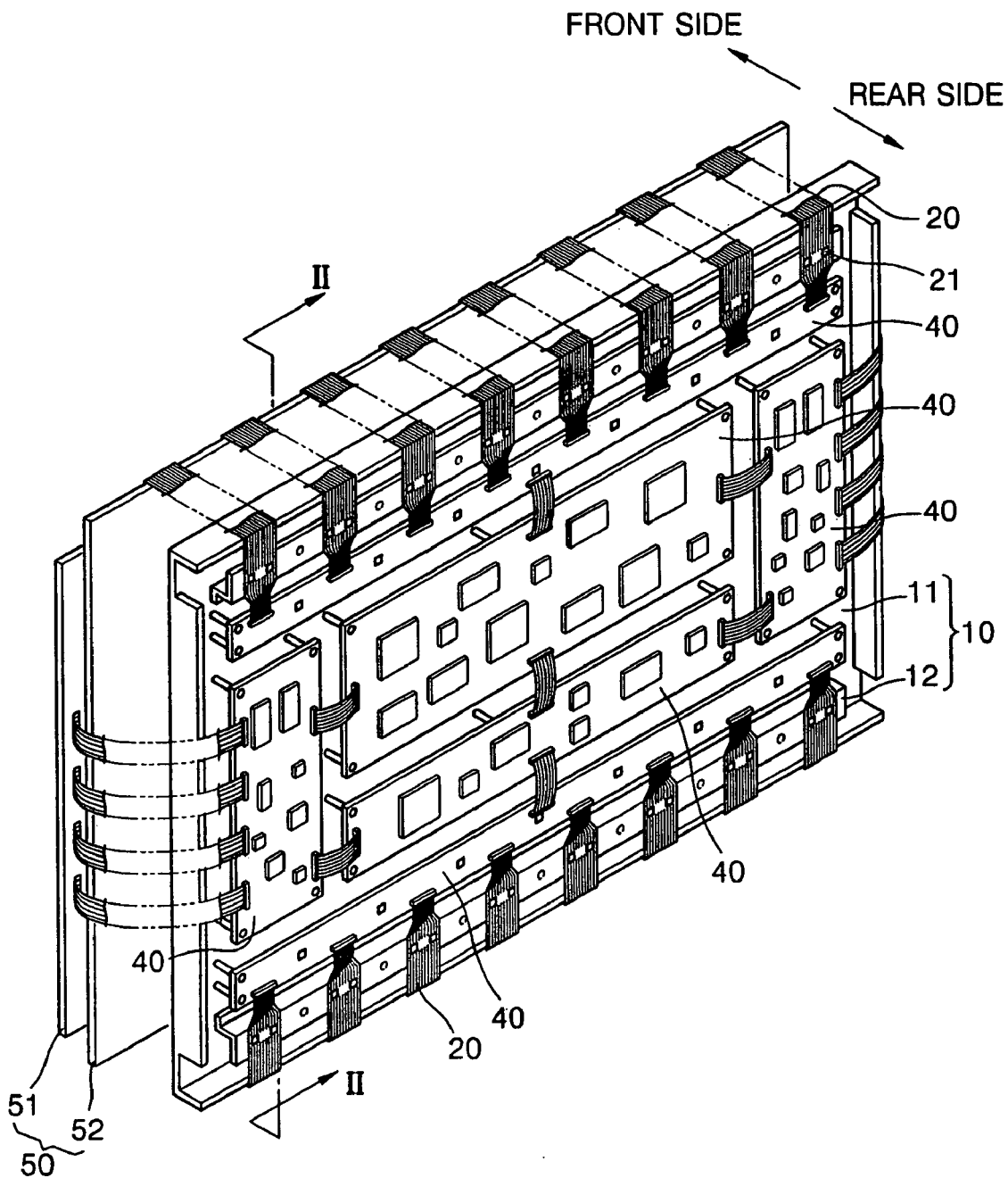
FIG. 1 is a perspective view of a display module of a plasma display device as an example to explain the structure of a typical display module according to prior art.
Figure 2:
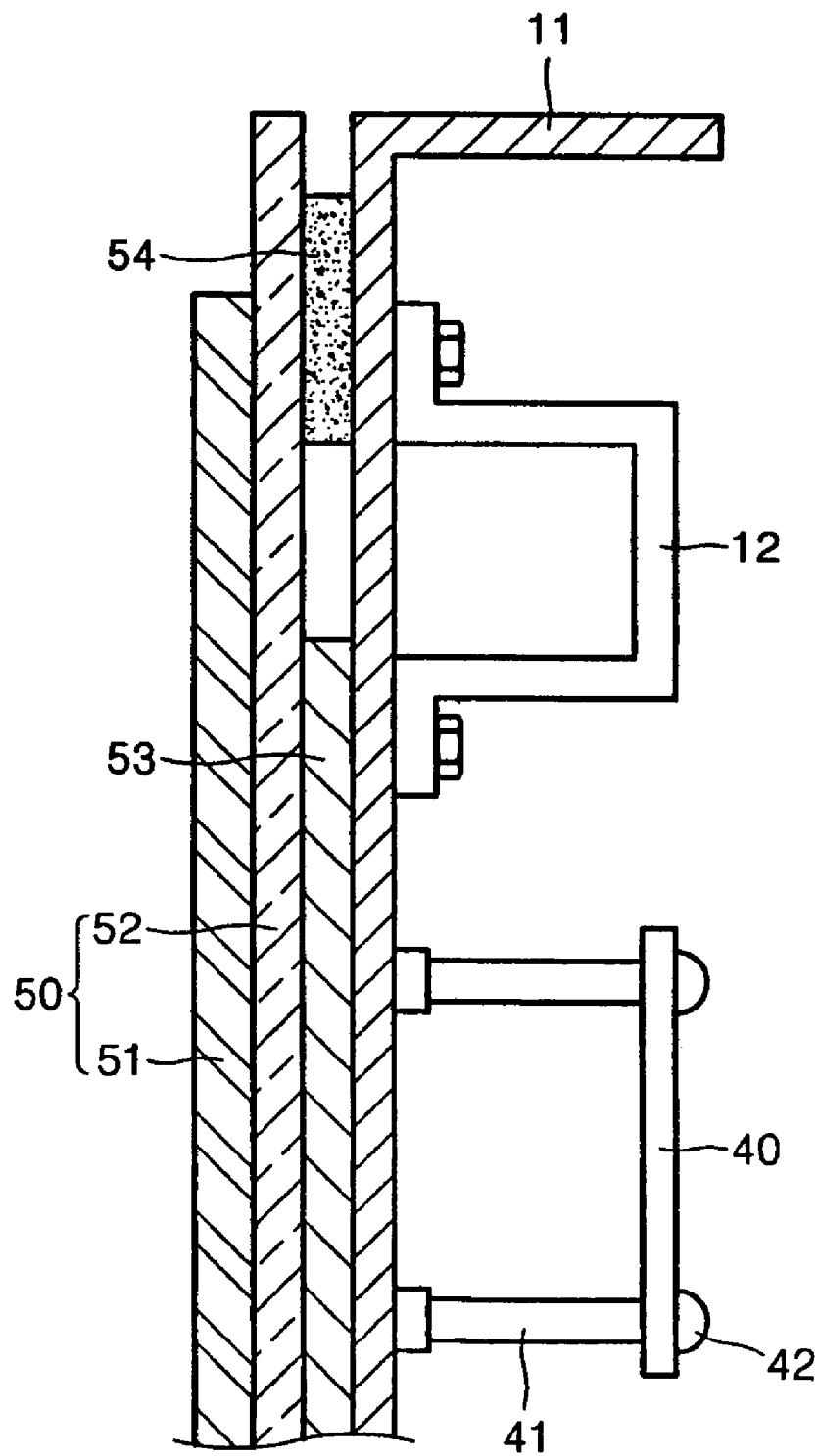
FIG. 2 is a cross-sectional view taken along line II-II of FIG. 1 according to prior art.

The chassis base 111 typically has a plate shape and supports the display panel 50 and the drive circuit board 40. In particular, the chassis base 111 is formed thin to reduce the overall weight of a display panel. However, as the size of the display panel 50 increases, the chassis base 111 is also strengthened to support the heavier display panel 50 and the drive circuit board 40. In one embodiment, as shown in FIG. 3, a curved or hollow portion 111a (hereinafter will be referred to "curved portion") having a predetermined width and length in a direction (for example, a latitudinal direction of the panel 50) is formed on the chassis base 111 to reinforce the strength of the chassis base 111. In another embodiment, a bent portion is formed at an end portion of the chassis base 111 to reinforce the strength of the chassis base 111. It is assumed that an external force may be applied to the chassis base 111 from both sides of the base 111 (see FIG. 1). In this situation, the curved portion 111a can provide better resistance against a possible deformation by the external force than a flat chassis base, i.e., without a curved portion.

In one embodiment, the boss 41 is installed on the curved portion 111a. In this embodiment, when a head portion of the boss 41 protrudes from a lower surface of the curved portion 111a, the head portion of the boss 41 does not interfere with the display panel 50. Furthermore, where a heat dissipation sheet 53 is provided between the display panel 50 and the chassis base 111, the head portion of the boss 41 does not interfere with the heat dissipation sheet 53 as shown in FIG. 3.

Figure 4:
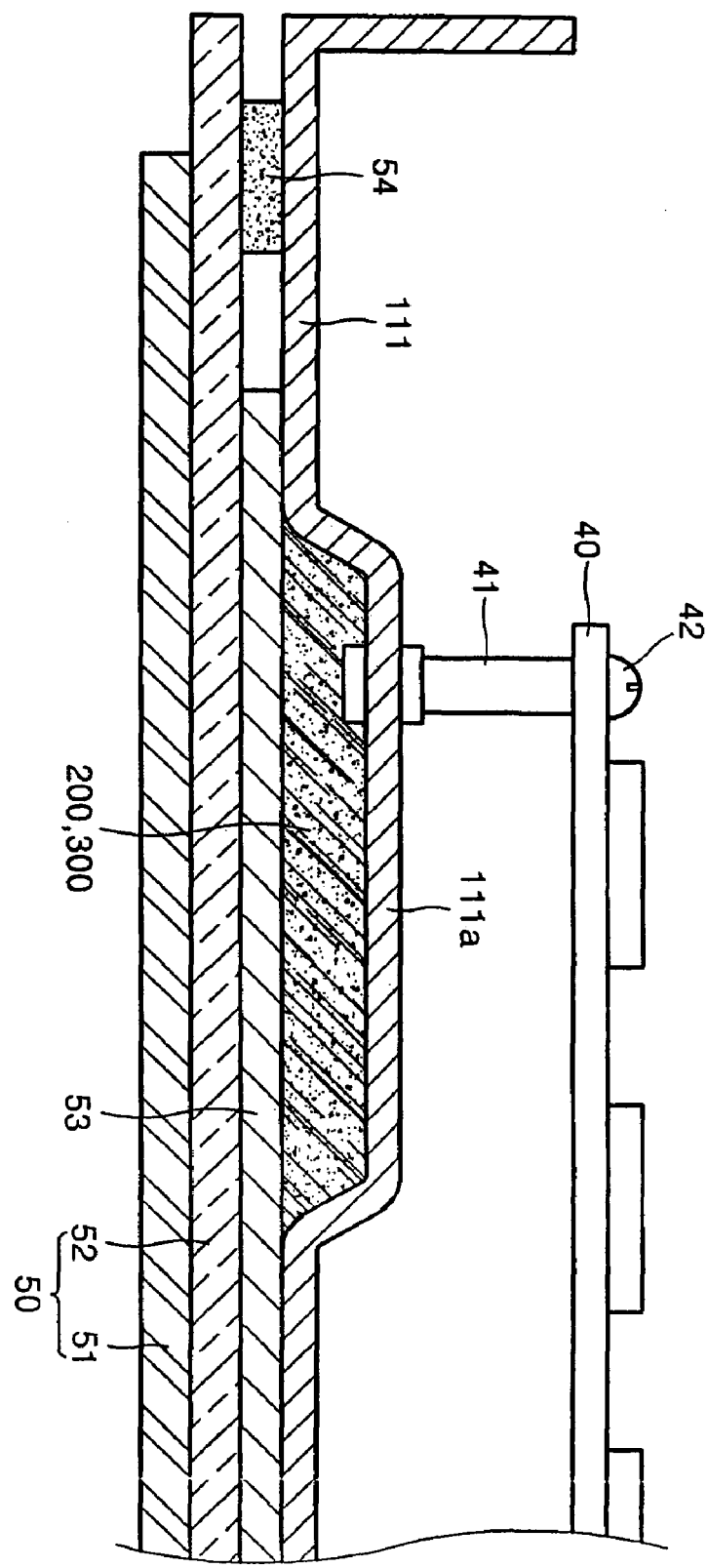
FIG. 4 is a cross-sectional view showing the structure of a display module according to another embodiment of the present invention.

FIG. 4 is a cross-sectional view showing the structure of a display module according to another embodiment of the present invention. Referring to FIG. 4, a heat transfer medium 200 is provided in a space 111b of FIG. 3 defined between the heat dissipation sheet 53 (or the rear panel 52, if no heat dissipation sheet is provided) and the curved portion 111a. The display panel 50 and the drive circuit board 40 may generate heat during operation. In particular, the amount of generated heat is considerable when the display panel 50 is a plasma display panel. A significant amount of the heat generated from the display panel 50 and the drive circuit board 40 is transferred toward the chassis base 111 disposed therebetween. When the heat transfer medium 200 is inserted in the space 111b, the heat can be smoothly dissipated through both end portions of the chassis base 111.

In one embodiment, the heat transfer medium 200 is formed of a material exhibiting a superior thermal conductivity such as graphite, silicon, acryl, or urethane. In another embodiment, to further improve conductivity, ferrite-based submicron particles or a conductive filter may be mixed when the heat transfer medium 200 is manufactured. However, the material for the heat transfer medium 200 is not limited to the above-described examples.

In one embodiment, a sound absorption (or noise reduction; hereinafter will be interchangeably used) member 300 may be provided in the space 111b of FIG. 3. When the display panel 50 is a plasma display panel, a large amount of noise is generated by plasma discharge. The noise generated from the display panel 50 and the drive circuit board 40 is mostly transferred toward the chassis base 111 in the form of vibrations. When noise and vibrations are met at the chassis base 111, the combined effects can be aggravated by amplification and resonance therebetween. When the sound absorption member 300 is inserted in the space 111b, the undesirable phenomenon can be prevented, and further transferal of the noise can also be prevented. In one embodiment, the sound absorption member 300 is formed of a porous material such as expanded polystyrene, sponge, or asbestos. However, the material for the sound absorption member 300 is not limited to the above-described examples.

In another embodiment, both the heat transfer medium 200 and the sound absorption member 300 may be provided in the space 111b. In this case, both heat dissipation performance and noise reduction performance can be improved. In one embodiment, for both the heat transfer medium 200 and the sound absorption member 300 to be installed in the space 111b, the composite material including the heat transfer medium 200 and the sound absorption member 300 can be installed in the space 111b. The composition ratio and the physical state of the heat transfer medium and the sound absorption member in the composite material can be varied in many ways.

As described above, according to embodiments of the present invention, the strength of the chassis base constituting the display module is reinforced, without requiring a separate reinforcement member, and simultaneously the heat and noise generated by the display panel and the drive circuit board during operation can be appropriately dissipated and prevented.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A display module, comprising:
   a display panel;
   a drive circuit board configured to drive the display panel;
   a chassis base supporting the display panel and the drive circuit board, wherein the chassis base comprises first and second flat portions and a curved portion, wherein the curved portion is interposed between and continuous from the flat portions, wherein the curved portion comprises i) a first sub-portion bent outwardly from the first flat section, ii) a second sub-portion extending from the first sub-portion in substantially parallel to the flat portions and iii) a third sub-portion extending from the second sub-portion and bent inwardly toward the second flat portion, and wherein the lengths of the first and third sub-portions is substantially less than that of the second sub-portion; and
   a boss provided on an upper surface of the curved portion, wherein the drive circuit board is provided on the top of the boss.

2. The display module as claimed in claim 1, further comprising:
   a heat dissipation sheet having a predetermined size smaller than the display panel and a double-sided adhesive tape disposed between the display panel and the chassis base; and
   a sound absorption member provided in a space defined by the curved portion and at least one of the heat dissipation sheet and the display panel.

3. The display module as claimed in claim 1, further comprising:
- a heat dissipation sheet and a double-sided adhesive tape disposed between the display panel and the chassis base; and
- a heat transfer medium provided in a space defined between the curved portion and at least one of the heat dissipation sheet and the display panel.

4. The display module as claimed in claim 1, further comprising:
- a heat dissipation sheet and a double-sided adhesive tape disposed between the display panel and the chassis base; and
- a noise reduction member and a heat transfer medium provided in a space formed between the curved portion and at least one of the heat dissipation sheet and the display panel.

5. The display module as claimed in claim 3, wherein the heat transfer medium is formed of one of the following: graphite, silicon, acryl, and urethane which exhibit superior heat conductivity.

6. The display module as claimed in claim 2, wherein the sound absorption material is formed of one of the following: expanded polystyrene, sponge, and asbestos which are porous materials.

7. The display module as claimed in claim 1, wherein the display module is for use with a plasma display panel.

8. The display module as claimed in claim 1, wherein the curved portion is formed in a latitudinal direction of the display panel.

9. A plasma display apparatus, comprising:
- a chassis base configured to support a display panel and a drive circuit board, wherein the chassis base comprises first and second flat portions and a curved portion, wherein the curved portion is interposed between and continuous from the flat portions, wherein the curved portion comprises i) a first sub-portion bent outwardly from the first flat portion, ii) a second sub-portion extending from the first sub-portion in substantially parallel to the flat portions and iii) a third sub-portion extending from the second sub-portion and bent inwardly toward the second flat portion, and wherein the lengths of the first and third sub-portions is substantially less than that of the second sub-portion; and
- a connecting member configured to connect the drive circuit board to the curved section of the chassis base.

10. The plasma display apparatus as claimed in claim 9, further comprising:
- a heat dissipation sheet located between the display panel and the chassis base; and
- at least one of a noise reduction member and a heat transfer medium provided in a space defined by the curved portion and the heat dissipation sheet.

11. A plasma display apparatus, comprising:
- a chassis base configured to support a display panel and a drive circuit board, wherein the chassis base comprises first and second flat portions and a curved portion, wherein the curved portion is interposed between and continuous from the flat portions, wherein the curved portion comprises i) a first sub-portion bent outwardly from the first flat section, ii) a second sub-portion extending from the first sub-portion in substantially parallel to the flat portions and iii) a third sub-portion extending from the second sub-portion and bent inwardly toward the second flat portion, and wherein the lengths of the first and third sub-portions is substantially less than that of the second sub-portion; and
- a connecting member configured to connect the drive circuit board to the curved portion of the chassis base,
- wherein the chassis base does not require a separate reinforcement member.

* * * * *